United States Patent [19]

Hokuyo et al.

[11] Patent Number: 5,009,720
[45] Date of Patent: Apr. 23, 1991

[54] SOLAR CELL

[75] Inventors: Shigeru Hokuyo; Takao Oda; Hideo Matsumoto, all of Itami, Japan

[73] Assignee: Mitsubishi Denki Kabushiki Kaisha, Japan

[21] Appl. No.: 437,981

[22] Filed: Nov. 9, 1989

[30] Foreign Application Priority Data

Nov. 16, 1988 [JP] Japan ................................ 63-290990
Aug. 19, 1989 [JP] Japan ................................ 1-213628

[51] Int. Cl.$^5$ ...................... H01L 31/06; H01L 31/18
[52] U.S. Cl. ............. 136/255; 136/262; 437/2; 437/5
[58] Field of Search ................. 136/244, 255, 262; 437/2-5

[56] References Cited

U.S. PATENT DOCUMENTS

| | | | |
|---|---|---|---|
| 3,912,539 | 10/1975 | Magee | 136/244 |
| 4,323,719 | 4/1982 | Green | 136/249 MS |
| 4,481,378 | 11/1984 | Lesk | 136/244 |
| 4,846,896 | 7/1989 | Hokoyo | 136/255 |
| 4,933,022 | 6/1990 | Swanson | 136/249 MS |
| 4,935,067 | 6/1990 | Sato et al. | 136/255 |

FOREIGN PATENT DOCUMENTS

| | | | |
|---|---|---|---|
| 1320775 | 2/1963 | France | 136/255 |
| 57-184255 | 11/1982 | Japan | 136/255 |
| 57-204180 | 12/1982 | Japan | 136/255 |
| 61-67968 | 4/1986 | Japan | 136/255 |

Primary Examiner—Aaron Weisstuch
Attorney, Agent, or Firm—Leydig, Voit & Mayer

[57] ABSTRACT

A solar cell for connection in series with a plurality of like cells to provide a solar generator which can produce a desired output voltage. The cell includes a photovoltaic section of compound semiconductor layers stacked on a semiconductor substrate to form a p-n junction and a protective diode section electrically isolated from the photovoltaic section by a p-n junction. The photovoltaic and diode sections are connected in parallel and reverse polarity. The protective diode bypasses current in the solar generator when no light is incident on the photovoltaic section in parallel with the respective diode.

15 Claims, 3 Drawing Sheets

SOLAR CELL

This invention relates to a solar cell, and, more particularly to a solar cell formed of a compound semiconductor and a method of making it. A plurality of such cells can be connected in series with each other to form a solar generator.

BACKGROUND OF THE INVENTION

Essentially, a solar cell is a semiconductor device having a diode structure which includes one p-n junction therein. Such a solar cell generates a relatively low voltage. Accordingly, when a practical solar generator is desired, a plurality of solar cells are usually connected in series so that the sum of the individually generated voltages becomes equal to a desired voltage. It is also well-known that a plurality of such series combinations of solar cells can be connected in parallel to provide a desired output current.

When some of a plurality of serially connected cells of a solar generator having the above-described structure enter into a shadow during operation so that no solar radiation is incident on those cells, the cells in the shadow cannot generate voltages but, rather, block current flow in the solar generator. Therefore the power provided by the solar generator device considerably decreases. In addition, when cells are considered in terms of diodes, the p-n junction of a cell in the shadow receives the sum of voltages generated by other cells connected in series, as a reverse voltage across it. If the reverse breakdown voltage and current carrying capacity is small, the p-n junction may be damaged.

There are two methods for eliminating the above-described problem. A first one is to increase the reverse breakdown voltage of a cell by employing a low impurity concentration base layer of the cell. Generally, however, it is required that a p-n junction of a solar cell be near to the solar radiation incident surface of the cell and, in particular, the distance from the surface of a p-n junction of a cell for extraterrestrial use should be less than 0.3–0.5 $\mu$m in order to increase the response to short wave length radiation. Practically, it is very difficult to form such a shallow p-n junction by a diffusion technique in a base layer which has an impurity concentration of, for example, $10^{13}$–$10^{14}$ atoms/cm$^3$ that is required for providing a reverse breakdown voltage of several hundred volts. Also, it is difficult to obtain such a low impurity concentration by a crystal growing technique. Thus, generally speaking, there is a limit on the reverse breakdown voltage which can be increased by this first method. In particular, this method is not suitable for high voltage generators.

A second method is to connect a protective diode in parallel in reverse polarity with a cell. This method of using a reverse polarity, parallel-connected diode may be practical, but, in order to connect protective diodes for a number of series combinations of cell, not only is space for the protective diodes required, but the fabrication of solar generator devices having such protective diodes takes time and labor, which causes the devices to be expensive. Furthermore, the reliability of such devices decreases due to the increase in number of constituent components. This is a great disadvantage, particularly, in devices for extraterrestrial use and, therefore, require high reliability.

U.S. Pat. No. 3,912,539 issued to Vincent Magee on Oct. 14, 1975 and assigned to Ferranti Limited discloses a solar cell array comprising a plurality of cells. Each of the cells of this U.S. patent comprises a photovoltaic section of a larger area and a diode section of a smaller area. The photovoltaic sections are connected in series with each other, and the diode sections are connected, as protective diodes, in parallel with the respective photovoltaic sections associated therewith. The array of this type is relatively free of the above-stated disadvantages. However, these cells are formed by separating a single p-n junction into a larger area photovoltaic section and a smaller area diode section with a groove, and the thus formed photovoltaic and diode sections share one of either the p and n layers. Accordingly, in a cell array, the diode section of each cell is connected in parallel with the photovoltaic section of the next cell. This requires complicated and time-consuming connections in the array. In addition, it is disadvantageously necessary to connect a discrete protective diode for the photovoltaic section of the first stage cell.

H. Matsutani discloses, in Japanese Patent Application No. SHO 59-190041 (Laid-Open Patent Publication No. SHO 61-67968), a cell which comprises a p-n junction forming a photovoltaic section, and a small opposite conductivity type diffusion region in a portion of the p-type or n-type layer of the p-n junction of the photovoltaic section. The small diffusion layer forms another p-n junction with the p-type or n-type layer in which it is formed. This additional p-n junction functions as a protective diode. The cells disclosed in this Japanese application, however, also have the same disadvantages as those of the cells disclosed in the aforementioned U.S. patent, because the photovoltaic section and the protective diode share a p-type or n-type layer.

Then, it has been proposed to form a photovoltaic section and a protective diode which are integral with each other and connected in an inverse-parallel relation, so that a solar generator can be produced without using discrete diodes as protective diodes.

GaAs solar cells based on this concept are disclosed by M. Yoshida et al in Japanese Patent Application No. SHO 56-69607 (Laid-Open Patent Publication No. SHO 57-184225) and Japanese Patent Application No. SHO 56-90109 (Laid-Open Patent Publication No. SHO 57-204180).

In order to form a built-in protective diode in a cell, it is usually necessary to electrically isolate an n-type (or p-type) layer of a photovoltaic section and an n-type (or p-type) layer of the protective diode section from each other. According to the techniques disclosed in the last two Japanese patent applications, in order to provide this electrical isolation, two spaced-apart solar cell structures (i.e. p-n junction elements) are formed on a semi-insulating substrate of a material such as GaAs and one of the two solar cell structures is used as a photovoltaic section and the other as a protective diode.

Since the substrate is semi-insulating in a solar cell of the type disclosed in the above-mentioned Japanese Published Patent Applications No. SHO 57-184255 and No. SHO 57-204180 which comprises a photovoltaic section and a protective diode, an n-type (or p-type) electrode that is a counterpart of the electrode on the light-incident surface of the photovoltaic section cannot be formed on the rear surface of the substrate. In order to form the n-type (or p-type) electrode, a portion of a p-type (or n-type) layer of the photovoltaic portion adjacent to the light-incident surface is removed to expose an n-type (or p-type) layer beneath the removed portion of the p-type (or n-type) layer, and then the n-type (or p-type) electrode can be formed on the exposed n-type (or p-type) layer portion. In this structure, however, because of the lateral resistance of the n-type (or p-type) layer, the internal series resistance of the solar generator increases and, therefore, the conversion efficiency decreases. Furthermore, since a portion of the light-incident surface is occupied by the n-type (or p-type) electrode, the effective light receiving area is reduced, which further decreases the conversion efficiency. In order to expose the portion of the n-type (or p-type) layer where the electrode is to be formed, the depth of etching has to be precisely controlled when the p-type (or n-type) layer overlying the portion of the n-type (or p-type) layer is selectively etched. If the p-type (or n-type) and the n-type (or p-type) layers are of the same material, such a precise etching depth control is very difficult.

An object of the present invention is to provide a solar cell comprising an integral combination of a photovoltaic section and a protective diode which are connected in an inverse-parallel relation, and, more particularly, to such a solar cell suitable for being connected in series with a plurality of other like cells to form a solar generator device which can produce a desired magnitude of output voltage.

Another object of the present invention is to provide a solar cell comprising an integral combination of a photovoltaic section and a protective diode which are connected in an inverse-parallel relation, and, more particularly, to such a solar cell which has small internal series resistance and a relatively large effective light receiving area. According to this feature of the invention, a practical solution to the problem of reduction in conversion efficiency is given.

Still another object of the present invention is to provide such a solar cell as stated above, of which fabrication does not require precise control of processing conditions that have been difficult, but only requires relatively simple processing.

A further object of the present invention is to provide a relatively simple method of fabricating a novel solar cell comprising an integral combination of a photovoltaic section and a protective diode connected in an inverse-parallel relation.

SUMMARY OF THE INVENTION

Solar cells meeting the above-stated objects of the present invention have a basic structure which is as follows: In a portion of a first surface of a semiconductor substrate of first conductivity type where a photovoltaic section of a solar cell is to be formed, a first semiconductor region of second conductivity type, opposite that of the substrate is formed, and a second semiconductor region of first conductivity type is formed, being separated from the substrate by the first semiconductor region. A protective diode is formed in this second semiconductor region. A solar cell photovoltaic section comprising a compound semiconductor is formed in the remaining portion of the first surface of the first conductivity type substrate. A first (front surface) electrode of the solar cell is formed to electrically connect an uppermost semiconductor layer of the photovoltaic section with said second semiconductor region. Also, a conductor is provided to electrically connect an uppermost semiconductor layer of the protective diode with the first surface of the substrate. A second (rear surface) electrode of the solar cell is formed on the opposed second surface of the substrate.

According to one aspect of the present invention, a solar cell comprises a semiconductor substrate of first conductivity type having a first surface in which a photovoltaic section of the cell is to be formed, a first semiconductor region of opposite second conductivity type formed in a portion of the first surface of the substrate, and a second semiconductor region of first conductivity type separated by the first region from the substrate. A protective diode and the photovoltaic section comprising stacked layers of the same compound semiconductor materials are formed respectively in a portion where the first semiconductor region is formed and in the remaining portion of the first surface of the substrate. A first (front surface) electrode of the cell is provided to electrically connect an uppermost semiconductor layer of the photovoltaic section with the second semiconductor region which is separated from the substrate by the first semiconductor region, and also a conductor is formed to electrically connect an uppermost semiconductor layer of the protective diode with the first surface of the substrate. A second (rear surface) electrode of the solar cell is formed on the second opposed surface of the substrate.

According to another aspect of the present invention, the protective diode in the above-described basic structure comprises a p-n junction formed between the second semiconductor region of first conductivity type and a third semiconductor region of second conductivity type formed in the second semiconductor region.

A method of fabricating a solar cell according to the present invention comprises preparing a semiconductor substrate of first conductivity type having first and second opposed major surfaces; forming, by diffusion or ion implantation, a first semiconductor region of second conductivity type opposite to that of the substrate in a portion of the first major surface of the substrate, and also a second semiconductor region of first conductivity type within the boundary of the first semiconductor region; growing a first layer of a compound semiconductor of first conductivity type over the first major surface of the substrate including the surfaces of the first and second regions; growing a second layer of the compound semiconductor of second conductivity type on the first compound semiconductor crystal layer; etching and removing predetermined portions of the first and second layers to separate a protective diode section comprising the first and second layers disposed in he second semiconductor region from a photovoltaic section comprising the first and second layers in the first surface portion of the substrate outside the boundary of the first semiconductor region; forming a metallic layer which electrically connects the second compound semiconductor layer of the photovoltaic section with the second semiconductor region, and a metallic layer which electrically connects the second compound semiconductor layer of the protective diode section with the first major surface of the substrate; and forming a metallic layer on he second major surface of the substrate.

According to another aspect of the method of fabricating a solar cell of the present invention, a semiconductor substrate of first conductivity type having first and second opposed major surfaces is first prepared, a first semiconductor region of second conductivity type opposite to that of the substrate is formed, by diffusion or ion implantation, in a portion of the first major surface of the substrate, a second semiconductor region of first conductivity type is formed, by diffusion or ion implantation, within the boundary of the first semiconductor region, and then a third semiconductor region of second conductivity type is formed, by diffusion or ion implantation, within the boundary of the second semiconductor region. A first layer of a compound semiconductor of first conductivity type is grown on the first major surface of the substrate, and a second layer of the compound semiconductor of second conductivity type is grown on the first compound semiconductor layer. Predetermined portions of the first and second layers are etched and removed in order to form a photovoltaic section of the cell comprising the first and second compound semiconductor layers only on the first major surface portion outside the boundary of the first semiconductor region. Next, a metallic layer which electrically connects the second layer of the photovoltaic section with said second region and a metallic layer which electrically connects the third region within the second region with the first surface of the substrate are formed. Then, a metallic layer is disposed on the second major surface of the substrate.

According to a method of fabricating a solar cell embodying another aspect of the present invention, a crystal growth preventing layer is disposed on a portion of the first major surface of the substrate where the layers of a compound semiconductor need not be grown, so that the etching process, which would otherwise be required, can be eliminated.

The solar cell of the present invention uses a semiconductor substrate, and, therefore, positive and negative electrodes of the cell can be disposed respectively on front and rear surfaces of the substrate. Accordingly, it is not necessary to expose the light-incident side of the n-type (or p-type) layer adjacent to the substrate in the photovoltaic section in order to form an electrode as opposed to the light-incident side electrode as required in the prior art. This eliminated loss of a considerable area of the light-receiving surface and also addition of internal series resistance which could be caused by the lateral resistance of the n-type (or p-type) layer. Accordingly, an undesirable reduction of conversion efficiency can be avoided. In addition, since selective etching, which is required for exposing the n-type (or p-type) layer for the formation of the above-stated electrode, is eliminated, no precise etching control is required so that the fabrication process is simplified and the cost of the solar cell can be reduced.

BRIEF DESCRIPTION OF THE DRAWINGS

The present invention is now described in detail with reference to the accompanying drawings.

DETAILED DESCRIPTION OF THE INVENTION

Figure 1:
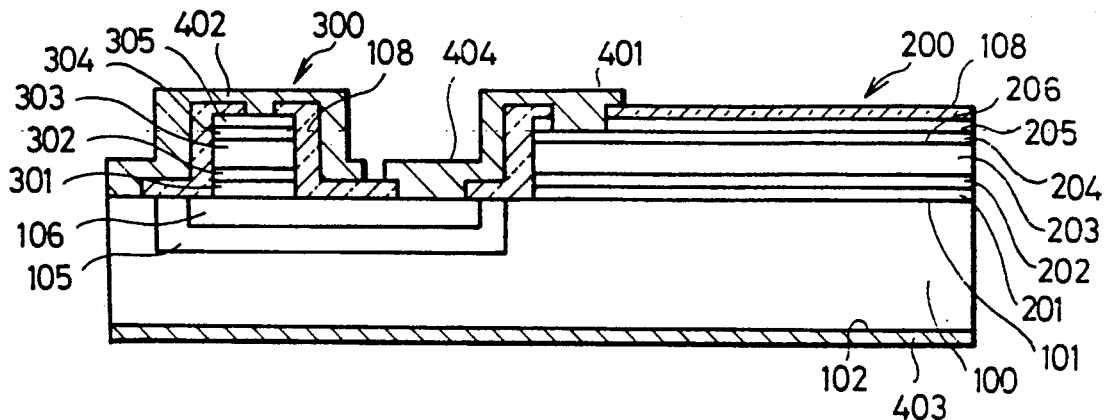
FIG. 1 is a cross-sectional view of a solar cell according to one embodiment of the present invention.

FIG. 1 shows a cross-section of a solar cell according to a first embodiment of the present invention. The solar cell shown in FIG. 1 is a GaAs/Si solar cell which includes a protective diode formed of GaAs. An n-type Si substrate 100 has a first major surface 101 and a second major surface 102. A photovoltaic section 200 of the solar cell and a protective diode 300 are formed on the first major surface 101 of the substrate 100. The photovoltaic section 200 comprises a multi-layered structure including an n-type high impurity concentration GaAs layer 201 on the substrate major surface 101, a lattice matching layer 202 comprising a GaAs/AlGaAs multi-layered structure, an n-type GaAs layer 203, a p-type GaAs layer 204, and a p-type AlGaAs layer 205 for preventing electrons produced in the p-type GaAs layer 204 from disappearing due to surface recombination. The protective diode 300 comprises layers 301, 302, 303, 304 and 305 which are of the same materials as the layers 201, 202, 203, 204 and 205 of the photovoltaic section 200, respectively. A p-type Si region 105 is formed, including a portion of the major surface 101 of the substrate, and an n-type Si region 106 is formed within the boundary of the p-type Si region 105, including a portion of the major surface 101. There is formed a silicon nitride ($Si_3N_4$) film 108. A first or positive (front surface) electrode 401 connects the layer 204 and the layer 106. A conductor layer 402 connects the p-type AlGaAs layer 305 of the protective diode 300 with the substrate 100. A second or negative (rear surface) electrode 403 is disposed on the second major surface 102.

Next a method of fabricating the solar cell shown in FIg. 1 is explained, referring to the cross-sectional views of the structure in various steps shown in FIGS. 2A to 2D.

Figure 2A:
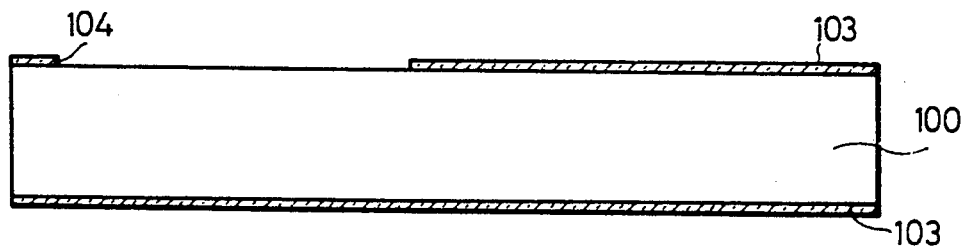
FIGS. 2A through 2D are cross-sectional views useful in explaining various steps of fabrication of the solar cell of the present invention shown in FIG. 1.
Figure 2B:
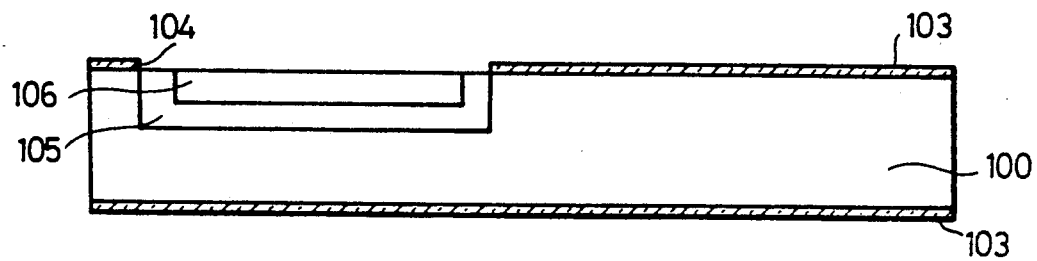

First, silicon oxide ($SiO_2$) films 103 are formed by thermally oxidizing the opposed major surfaces of the n-type Si substrate 100 at 1100° C.–1200° C., and a portion of the oxide film 103 on the first major surface 101 is removed by a well-known photoetching technique to form a window 104 in the film 103. Thus a desired mask for selective diffusion is formed (FIG. 2A). The substrate with this selective diffusion mask is subjected to a heat treatment at about 900° C. for 30–90 minutes in an $N_2$ (nitrogen) atmosphere containing about 1.5% of $B_2H_6$ (diborane) and about 0.5% of $O_2$ (oxygen) to deposit B (boron), and after that, the structure is subjected to 1200° C. for several hours to diffuse B into the substrate through the window 104. Thus, the p-type region 105 is formed. Then, a selective diffusion mask with a smaller window (not shown) is formed within the window 104, and the structure is subjected to a treatment, similar to the one stated above, at about 1000° C. in an $N_2$ atmosphere containing about 2% of $PH_3$ (phosphine) and about 1% of $O_2$ (oxygen). Then, the structure is provided with a treatment like the one stated above to diffuse P (phosphorus) for forming the n-type region 106 (FIG. 2B).

The above-described p-type and n-type regions may be formed by an ion implantation technique instead of a diffusion technique. In such a case, the photoresist mask which has been used for forming the window 104 in the oxide film 103 is now used as a mask for ion implantation. The p-type region 105 is formed by implanting B from a p-type impurity source, $BF_3$ (boron trifluoride), for example. The n-type region 106 is formed by implanting As or P from an n-type impurity source, such as $AsH_3$ (arsine) or $PH_3$ (phosphine). The ions are implanted at energies of 50–100 KeV.

Next, the silicon oxide film 103 on the first major surface 101 of the substrate 100 is removed with a conventional etchant such as an aqueous solution of hydrofluoric acid or ammonium fluoride. Thereafter, in order to form a p-n junction 206 functioning as a GaAs solar cell on the same major surface 101, an MOCVD (metal organic chemical vapor deposition) technique is used to form a stack of layers by successively growing the n-type high impurity concentration GaAs layer 201, the lattice matching layer 202, the n-type GaAs layer 203, the p-type GaAs layer 204 and the p-type AlGaAs layer 205. The formation of the GaAs layers is carried out in a reaction furnace maintained at about 800° C. into which $(CH_3)_3Ga$ (trimethylgallium) and $AsH_3$ (arsine) are introduced with $H_2$ used as a carrier gas. For forming the n-type layers, Zn is added in the form of $(C_2H_5)_2Zn$ (diethylzinc) as an impurity, and for the formation of the p-type layers, Se (selenium) is added in the form of $H_2Se$ (hydrogen selenide) as an impurity. The AlGaAs layer is formed in a similar manner by adding $(CH_3)_3Al$ (trimethylaluminum) gas to the above-stated $H_2$, $(CH_3)_3Ga$ and $AsH_3$. For providing p-type conductivity, $H_2Se$ is added. Usually, the layer 202 comprises a stack of from three to tn AlGaAs/GaAs layers.

Figure 2C:
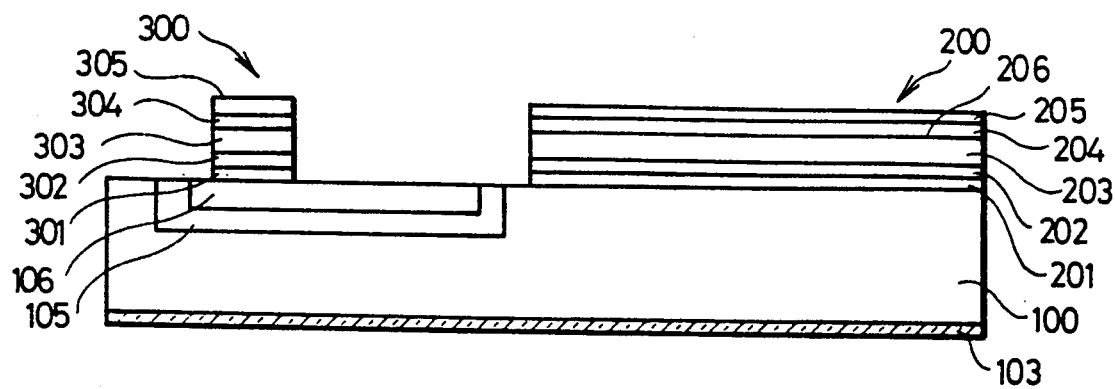
Figure 2D:
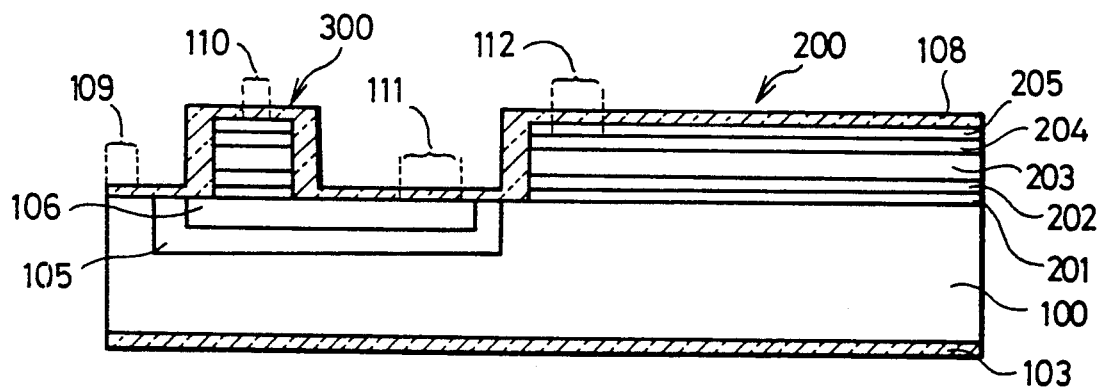

Next, portions of the vapor deposited layers 201-205 are removed from the portions of the surface of the Si substrate 100 where the p-n junctions (the p-n junction between the substrate and the region 106 and the p-n junction between the regions 105 and 106) intersect the surface 101 and the surfaces of portions of the p-type region 105 and the n-type region 106. This removal treatment is carried out by a well-known selective etching technique using, for example, an aqueous solution of hydrofluoric acid or nitric acid as an etchant. Thus, the solar cell photovoltaic section 200 and the protective diode section 300 are separated into independent sections (FIG. 2C). In the drawings, the layers constituting the protective diode 300 are given reference numerals 301, 302, 303, 304 and 305 which correspond to the respective layers 201, 202, 203, 204 and 205 of the photovoltaic section 200.

Instead of etching and removing portions of the layers of separate the photovoltaic section 200 and the protective diode section 300 from each other, a crystal growth preventing layer such as a silicon oxide film or a silicon nitride film may be formed on the corresponding portions of the substrate surface before the stacked layers 201-205 are formed, so that the photovoltaic section and the protective diode section can be separately formed.

After that, an $Si_3N_4$ (silicon nitride) film 108 is formed over the entire surface of the structure on the first major surface side. The $Si_3N_4$ film 108 serves as an anti-reflection film and an insulator film for metallic wiring. This silicon nitride film may be formed by a CVD technique using $N_2$ (nitrogen) as a carrier gas for $NH_3$ (ammonia) and $SiH_4$ or $SiH_2Cl_2$ (silane) gases and employing a deposition temperature of about 800° C. After that the silicon nitride film 108 at predetermined portions, namely, portions 109, 110, 111 and 112 indicated by pairs of broken lines in FIG. 2D together with the AlGaAs layer 205 at the portion 112 is removed by photo-etching. The silicon nitride film can be removed by plasma etching using a fluorine plasma and a photoresist mask. The AlGaAs layer can be etched by an aqueous solution of hydrofluoric acid or nitric acid. Then, the electrode metal layers 401, 402 and 404 are formed at the predetermined portions of the protective diode 300 and the photovoltaic section 200 by sputtering or vapor deposition (see FIG. 1). The positive electrode 401 of the photovoltaic section 200 connects the p-type GaAs layer 204 with the n-type region 106, and the electrode 402 of the protective diode 300 connects the p-type AlGaAs layer 305 with the exposed first major surface 101 of the substrate 100. The oxide film 103 on the second surface 102 of the substrate 100 is also removed, and a metallic layer is disposed on the exposed surface which acts as the negative electrode 403 (FIG. 1). The positive electrode 401 and the electrode 402 should extend to substantially completely shield, from incident light at least portions of the surface 101 including the portions in the vicinity of the intersections of the p-n junctions with the surface 101, the surface portions of the regions 105 and 106 and the surface of the protective diode 300. A multi-layered structure comprising, for example, Au-Ge-Ni alloy and Ag layers, is suitable as the electrode metallic layer to be deposited on the n-type GaAs layer, and a multi-layered structure comprising, for example, Ti and Ag layers is suitable to be deposited on other portions.

Figure 3:
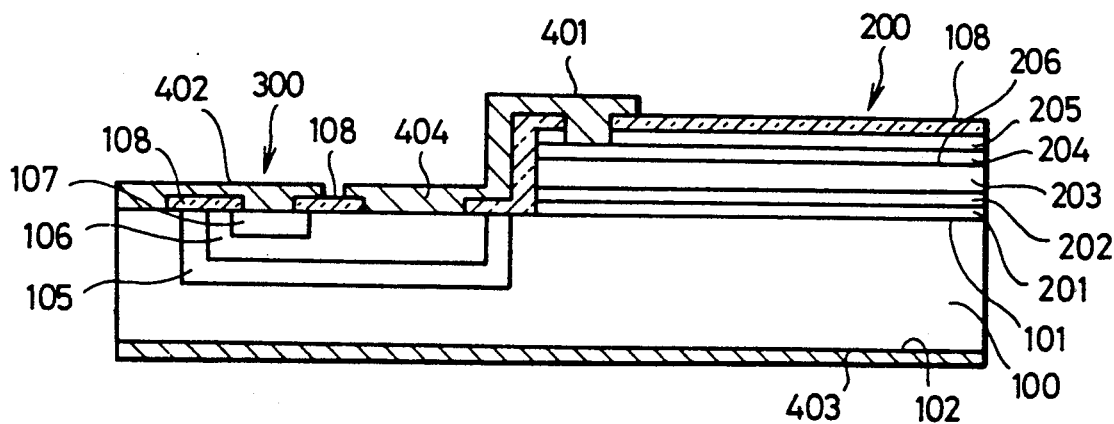
FIG. 3 is a cross-sectional view of a solar cell according to another embodiment of the present invention.

FIG. 3 is a cross-sectional view of a solar cell according to a second embodiment of the present invention, and FIGS. 4A through 4D are cross-sectional views of the solar cell of FIG. 3 in various manufacturing steps. In FIG. 3 and in FIGS. 4A-4D, the same reference numerals denote the same or equivalent items or functions as those shown in FIG. 1 and FIGS. 2A-2D.

The solar cell shown in FIG. 3 is similar in structure to the solar cell shown in FIG. 1 except that the protective diode 300 is formed within the Si substrate 100. While the protective diode 300 of the cell of FIG. 1 comprises the stacked GaAs and AlGaAs layers on the surface of the n-type region 106 which is separated by the p-type region 105 from the remaining portion of the substrate, the diode of the cell of FIG. 3 is formed as an Si diode by the n-type region 106 and a p-type region 107 which is formed in the n-type region 106. The substrate 100, and the GaAs layers 201, 203 and 204 of the respective conductivity types, the lattice matching layer 202, the AlGaAs layer 205, the silicon nitride film 108 and the electrodes 401 and 403 which altogether form the photovoltaic section of the cell of FIG. 3 are all the same as those of FIG. 1.

The solar cell of FIg. 3 can be fabricated by a process which is substantially the same as but partly different from the one employed for fabricating the cell of FIG. 1.

Figure 4A:
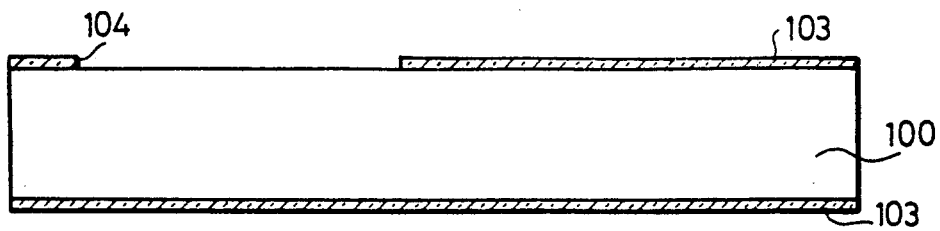
FIGS. 4A through 4D are cross-sectional views useful in explaining various steps of fabrication of the solar cell of the present invention shown in FIG. 3.
Figure 4B:
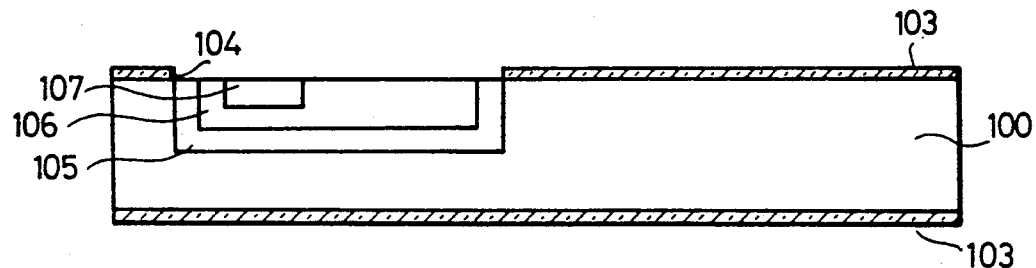

Specifically, first the n-type Si substrate 100 is prepared (FIG. 4A), and the silicon oxide films 103 are formed on the opposed two major surfaces of the substrate by thermal oxidation, and the window 104 is provided in the film 103 (FIG. 4A). Thereafter, B (boron) is diffused through the window 104 into the substrate to form the p-type region 105. P (phosphorus) is then diffused to form the n-type region 106. The steps thus far described are the same as the ones described with reference to FIGS. 2A and 2B. Next, the p-type region 107 is formed in the n-type region 106. The p-type region 107 can be formed in a manner similar to the one for the region 105, but a slightly higher temperature of, for example, about 1100° C., is used for depositing a diffusion source for the region 107 so that the region 107 will have a higher dopant concentration.

Figure 4C:
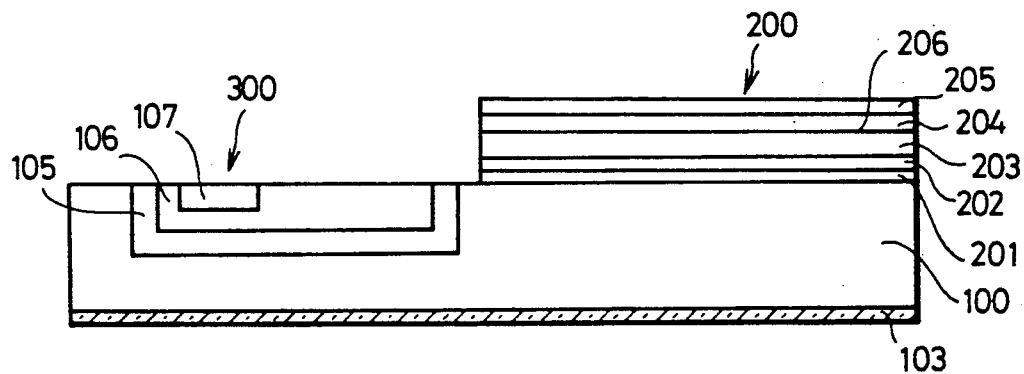

Then, the silicon oxide film 103 on the light receiving side, i.e. on the first major surface 101, is removed. Thereafter, in order to produce the p-n junction 206 which functions as a solar cell on the thus exposed surface, the n-type high impurity concentration layer 201, the lattice matching layer 202, the n-type GaAs layer 203, the p-type GaAs layer, 204 and the p-type AlGaAs layer 205 are successively grown to produce a stack of layers. Next, portions of the stacked layers are etched and removed from a predetermined portion of the substrate surface 101 including at least the p-n junctions exposed at the substrate surface and their vicinity, and the surfaces of the regions 105, 106 and 107, so that the photovoltaic section 200 and the protective diode 300 are separated (FIG. 4C). The stacked layer forming step and the separating step are same as the ones previously explained with reference to FIG. 2C.

Figure 4D:
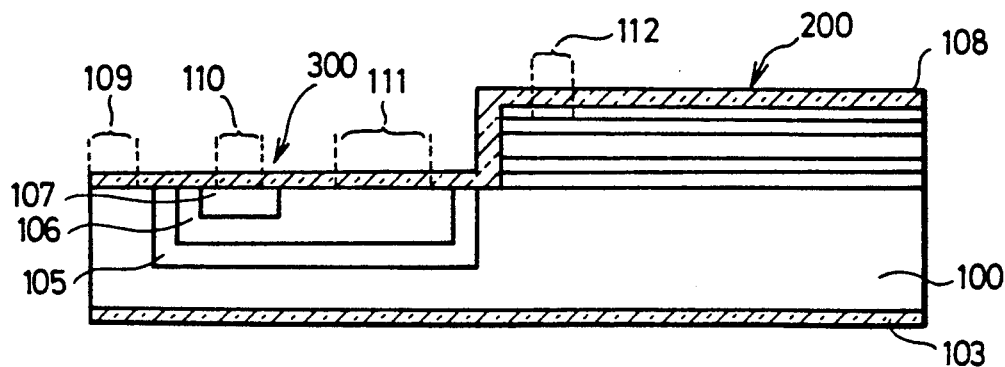

After that, as shown in FIg. 4D, the silicon nitride film 108 is formed over the entire surface on the first major surface side of the structure, which film 108 provides an anti-reflection film and an insulating film for metal wiring. Then, the silicon nitride film 108 is removed from predetermined portions indicated by pairs of broken lines 109, 110, 111 and 112, together with the AlGaAs layer 205 at the portion 112. The metallic layers of electrodes 401, 402 and 404 are then formed at predetermined portions of the protective diode 300 section and the photovoltaic section 200. The positive electrode 401 connects the p-type GaAs layer 204 to the n-type region 106, and the electrode 402 of the protective diode 300 connects the p-type region 107 to an exposed portion of the first major surface of the substrate 100. The electrodes 401 and 402 extend to substantially completely shield at least the intersections of the p-n junctions with the substrate surface and their vicinity, the surface of the n-type region 106 and the surfaces of the p-type regions 105 and 107, from incident light. The oxide film 103 on the second surface 102 of the substrate 100 is also removed, and the metallic negative electrode 403 is deposited. Thus, the device is completed (FIG. 3).

When light is incident on the light receiving surface of a solar cell having the structure according to the first or second embodiment of the present invention described above, a photoelectromotive force is generated between the p-type GaAs layer 204 and the n-type GaAs layer 203 so that the photovoltaic section 200 acts as a solar cell. On the other hand, the protective diode 300 with the electrode 402, the n-type region 106 and the electrode 401 is connected in parallel with and with reverse polarity to the photovoltaic section 200. A number of such solar cells are connected in series to produce a solar generator. When some of the cells in the solar generator are shadowed, the voltage generated by the other cells forward biases the protective diodes to render them conductive so that reverse breakdown of the shadowed cells is prevented and, at the same time, current is bypassed through the protective diodes to thereby prevent reduction of the conversion efficiency of the device. Since the protective diode is connected in an inverse-parallel relation to the photovoltaic section, it could generate photoelectromotive force in opposite direction to that of the solar cell itself. However, since the electrodes cover the light-incident side of the protective diode and the p-n junctions surrounding the protective diode to shield them from incident light, the reverse electromotive force generating capability of the diode never adversely affects the photoelectromotive force generating capability of the photovoltaic section.

In addition to the above-stated advantages, the solar cell of the present invention has many other advantages including the following ones.

(1) The use of conductive semiconductor material rather than insulating or semi-insulating material for the substrate makes it possible to dispose first and second electrodes of the cell on the light-incident side and the opposed side of the substrate so that the effective light receiving area and the conversion efficiency are large relative to conventional solar cells which have both electrodes disposed on the light-incident side.

(2) Since the second electrode can be disposed on the surface opposite to the light-incident surface of the substrate, it is no longer necessary to expose a portion of the n-type (or p-type) layer of the photovoltaic section and, consequently, there is no reduction in conversion efficiency due to the lateral resistance of such an exposed n-type (or p-type) layer.

(3) Since it is possible to connect the first electrode to an external conductor at an electrode portion on the n-type (or p-type) region in the substrate (i.e. at the portion 404 in FIGS. 1 and 3), it is possible to avoid the danger that the p-n junction of the photovoltaic section could be damaged by heat produced during parallel gap bonding of that connection.

(4) As it is no longer necessary to expose a portion of the n-type (or p-type) layer of the photovoltaic section for forming the second electrode, the step of selectively removing the overlying layers, that is, the etching which requires highly precise control in the depth direction, is eliminated.

(5) The separation of the protective diode using a p-n junction within the substrate from the photovoltaic section is relatively easy, and the remaining steps are also simple.

(6) By virtue of the structure in which the protective diode is incorporated in the same cell as the photovoltaic section, and also by virtue of the above-stated advantages (4) and (5) in the manufacturing process, the cost of the solar cell and, hence, the cost of the solar generator can be reduced.

In the description heretofore, the present invention is described as being applied to a so-called "p-on-n" type GaAs cell using an Si substrate (i.e. GaAs/Si solar cell). However, it should be noted that various modifications are possible. For example, Ge or a compound semiconductor such as GaAs may be used as a substrate material instead of Si. Also, the material of the active section of the cell and the diode is not limited to GaAs, but other compound semiconductors such as InP, CdS, CdTe and CuInSe$_2$ may be used. Of course, the "n-on-p" configuration can be employed.

What is claimed is:

1. A solar cell comprising:
   a semiconductor substrate of a first conductivity type having opposed first and second major surfaces;
   a first region of a second conductivity type extending from a portion of said first major surface into said substrate;
   a second region of the first conductivity type disposed within said first region and including said first major surface;
   a photovoltaic section disposed on said first major surface and spaced from said first region including a first compound semiconductor layer of the first conductivity type and a second compound semiconductor layer of the second conductivity type disposed on said first compound semiconductor layer;
   a diode section disposed within said second region of first conductivity type and including diode regions of first and second conductivity type;

a first electrode connecting said second compound semiconductor layer in reverse polarity to said diode section through said second region of first conductivity type; and a second electrode disposed on said first major surface of said substrate whereby said diode region of second conductivity type is electrically connected to said first conductivity type substrate.

2. A solar cell according to claim 1, wherein said diode section includes a compound semiconductor layer of first conductivity type disposed on said second region of first conductivity type and a compound semiconductor layer of second conductivity type.

3. A solar cell according to claim 2 wherein portions of said first major surface of said first conductivity type substrate including the junction between said first conductivity type substrate and said second conductivity type first region and the junction between said second conductivity type first region and said first conductivity type second region are shielded from incident light by at least one of said first and second electrodes.

4. A solar cell according to claim 2 wherein a portion of said first electrode is disposed on said second region for connection to an external conductor.

5. A solar cell according to claim 1, wherein said diode section is includes said second region of first conductivity type and a third region of second conductivity type disposed in said second region.

6. A solar cell according to claim 5 wherein portions of said first major surface of said first conductivity type substrate including the junction between said first conductivity type substrate and said second conductivity type first region, the junction between said second conductivity type first region and said first conductivity type second region, and the junction between said first conductivity type second region and said second conductivity type third region are shielded from incident light at least one of said first and second electrodes.

7. A solar cell according to claim 5 wherein a portion of said first electrode is disposed on said second region for connection to an external conductor.

8. A solar cell according to claim 1 wherein portions of said first major surface of said first conductivity type substrate including the junction between said first conductivity type substrate and said second conductivity type first region and the junction between said second conductivity type first region and said first conductivity type second region are shielded from incident light by at least one of said first and second electrodes.

9. A solar cell according to claim 1 wherein a portion of said first electrode is disposed on said second region for connection to an external conductor.

10. A solar cell according to claim 1 wherein said semiconductor substrate is selected from the group consisting of Si and GaAs.

11. A solar cell according to claim 1 wherein said compound semiconductor is one selected from the group consisting of GaAs, InP, CdS, CdTe, and CuInSe$_2$.

12. A method of making a solar cell comprising:
preparing a semiconductor substrate of a first conductivity type having first and second opposed major surfaces;
forming a first region of a second conductivity type opposite the first conductivity type in a portion of said substrate at said first major surface and a second region of the first conductivity type within said first region of the second conductivity type;
growing a first layer of a compound semiconductor of the first conductivity type on said first major surface including on said first and second regions;
growing a second layer of a compound semiconductor of the second conductivity type on said first compound semiconductor layer;
removing predetermined portion of said first and second compound semiconductor layers to form a protective diode section comprising said first and second compound semiconductor layers on said second region and to form a photovoltaic section comprising said first and second compound semiconductor layers on said first major surface outside said first region;
depositing metallic layers connecting said second compound semiconductor layer of said photovoltaic section with said second region and connecting said second compound semiconductor layer of said protective diode section with said first major surface of said first conductivity type substrate; and
depositing a metallic layer on said second major surface of said substrate.

13. A method of making a solar cell comprising:
preparing a semiconductor substrate of a first conductivity type having first and second opposed major surfaces;
forming a first region of a second conductivity type opposite the first conductivity type in a portion of said substrate at said first major surface and a second region of the second conductivity type within said first region of the second conductivity type;
depositing a crystal-growth preventing layer over said first region and part of said second region, leaving an exposed portion of the second region;
growing a first layer of a compound semiconductor of the first conductivity type on the exposed portion of said second portion and the portion of said first major surface which is not covered by said crystal-growth preventing layer;
growing a second layer of a compound semiconductor of the second conductivity type on said first compound semiconductor layer;
depositing metallic layers connecting said second one of said grown compound semiconductor layers on said second region with said first major surface of said first conductivity type substrate and connecting said second one of said first and second compound semiconductor layers on said first major surface portion which is not covered by said crystal-growth preventing layer with said second region; and
depositing a metallic layer on said second major surface of said substrate.

14. A method of making a solar cell comprising:
preparing a semiconductor substrate of a first conductivity type having first and second opposed surfaces;
forming a first region of a second conductivity type opposite the first conductivity type in a portion of said substrate at said first surface of said substrate;
forming a second region of the first conductivity type within said first region;
forming a third region of the second conductivity type within said second region;
growing a first layer of a compound semiconductor of the first conductivity type on said first major surface including the surfaces of said first, second, and third regions and a second layer of a compound semiconductor of the second conductivity type on said first compound semiconductor layer;

removing said first and second compound semiconductor layers on at least a portion of said first major surface including the surfaces of said first, second, and third regions;

depositing metallic layers connecting the second compound semiconductor layer disposed on said first major surface with said second region and connecting said third region with said first major surface of said first conductivity type; and depositing a metallic layer on said second major surface of said substrate.

15. A method of making a solar cell comprising:

preparing a semiconductor substrate of a first conductivity type having first and second opposed major surfaces;

forming a first region of a second conductivity type opposite the first conductivity type in a portion of said substrate at said first major surface, a second region of the first conductivity type within said first region, and a third region of second conductivity type within the boundary of said second region;

forming a crystal-growth preventing layer over at least a portion of said first major surface including the surfaces of said first, second, and third regions;

growing a first layer of a compound semiconductor of the first conductivity type on said first major surface of said substrate growing a second layer of a compound semiconductor of the second conductivity type on said first compound semiconductor layer;

depositing metallic layers connecting said second compound semiconductor layer with said second region and connecting said third region with said first major surface of said first conducting type substrate; and depositing a metallic layer on said second major surface of said substrate.

* * * * *

UNITED STATES PATENT AND TRADEMARK OFFICE
CERTIFICATE OF CORRECTION

PATENT NO. : 5,009,720

DATED : April 23, 1991

INVENTOR(S) : Hokuyo et al.

It is certified that error appears in the above-identified patent and that said Letters Patent is hereby corrected as shown below:

On the title page:
In item [57] Abstract, line 11, after "section" insert --connected--.

Column 11, line 38, after "light" insert --by--.

Column 12, line 7, change "portion" to --portions--;

line 37, change "portion" (first occurrence) to --region--.

Column 13, line 11, after "type" insert --substrate--.

Column 14, line 9, after "substrate" insert --;--;

line 17, change "conducting" to --conductivity--.

Signed and Sealed this

Eighth Day of September, 1992

Attest:

DOUGLAS B. COMER

*Attesting Officer*     *Acting Commissioner of Patents and Trademarks*